(12) United States Patent
Ferreira et al.

(10) Patent No.: US 6,977,516 B2
(45) Date of Patent: Dec. 20, 2005

(54) SEMI-CONDUCTOR COMPONENT TESTING SYSTEM WITH A REDUCED NUMBER OF TEST CHANNELS

(75) Inventors: Jesus Ferreira, Munich (DE); Jochen Kallscheuer, Munich (DE)

(73) Assignee: Infineon Technolgies AG, (DE)

( * ) Notice: Subject to any disclaimer, the term of this patent is extended or adjusted under 35 U.S.C. 154(b) by 83 days.

(21) Appl. No.: 10/651,803

(22) Filed: Aug. 29, 2003

(65) Prior Publication Data

US 2005/0099201 A1 May 12, 2005

(30) Foreign Application Priority Data

Sep. 5, 2002 (DE) ................. 102 41 141

(51) Int. Cl.[7] .......................................... G01R 31/26
(52) U.S. Cl. ..................................... 324/765
(58) Field of Search ................. 324/760–765, 324/758, 158.1; 382/145; 438/14–17, 106; 702/80–84, 702/117, 118

(56) References Cited

U.S. PATENT DOCUMENTS

| | | | | | |
|---|---|---|---|---|---|
| 4,419,747 | A | * | 12/1983 | Jordan ........................ 365/201 |
| 4,510,673 | A | * | 4/1985 | Shils et al. .................... 438/15 |
| 5,043,657 | A | | 8/1991 | Amazeen et al. ............ 324/158 |
| 5,056,061 | A | * | 10/1991 | Akylas et al. ................ 365/96 |
| 5,103,166 | A | * | 4/1992 | Jeon et al. ................... 324/764 |
| 5,155,432 | A | * | 10/1992 | Mahoney ..................... 324/763 |
| 5,381,417 | A | * | 1/1995 | Loopik et al. ............... 714/724 |
| 5,642,307 | A | * | 6/1997 | Jernigan ....................... 438/18 |
| 5,818,249 | A | * | 10/1998 | Momohara ................... 324/762 |
| 5,867,505 | A | | 2/1999 | Beffa .......................... 327/21.1 |
| 6,072,325 | A | * | 6/2000 | Sano ........................... 324/758 |
| 6,154,043 | A | * | 11/2000 | Conboy et al. ............. 324/764 |
| 6,161,213 | A | * | 12/2000 | Lofstrom ..................... 324/764 |
| 6,348,810 | B1 | * | 2/2002 | Yanagawa et al. .......... 324/765 |
| 6,367,042 | B1 | * | 4/2002 | Phan et al. .................. 714/733 |
| 6,477,095 | B2 | | 11/2002 | White et al. ................. 365/201 |
| 6,600,686 | B2 | * | 7/2003 | Huh et al. ..................... 438/18 |
| 6,617,172 | B2 | * | 9/2003 | Usami ............................ 438/2 |
| 6,727,723 | B2 | * | 4/2004 | Shimizu et al. ............. 324/765 |
| 6,747,473 | B2 | * | 6/2004 | Cowan ........................ 324/765 |
| 6,812,477 | B2 | * | 11/2004 | Matsunami ................. 250/548 |
| 6,825,052 | B2 | * | 11/2004 | Eldridge et al. ............ 324/765 |

FOREIGN PATENT DOCUMENTS

JP            06112101 A  *  4/1994  .......... H01L 21/00

* cited by examiner

*Primary Examiner*—Jermele Hollington
(74) *Attorney, Agent, or Firm*—St. Onge Steward Johnston & Reens LLC

(57) ABSTRACT

The invention involves a semi-conductor component testing system, a process for semi-conductor components, as well as an assembly, more particularly a wafer with several semi-conductor components to be tested, whereby each semi-conductor component is allocated an individual identifying label, more particularly an identification-number, in order to perform the test—done individually for each semi-conductor component—on the respective semi-conductor component.

11 Claims, 3 Drawing Sheets

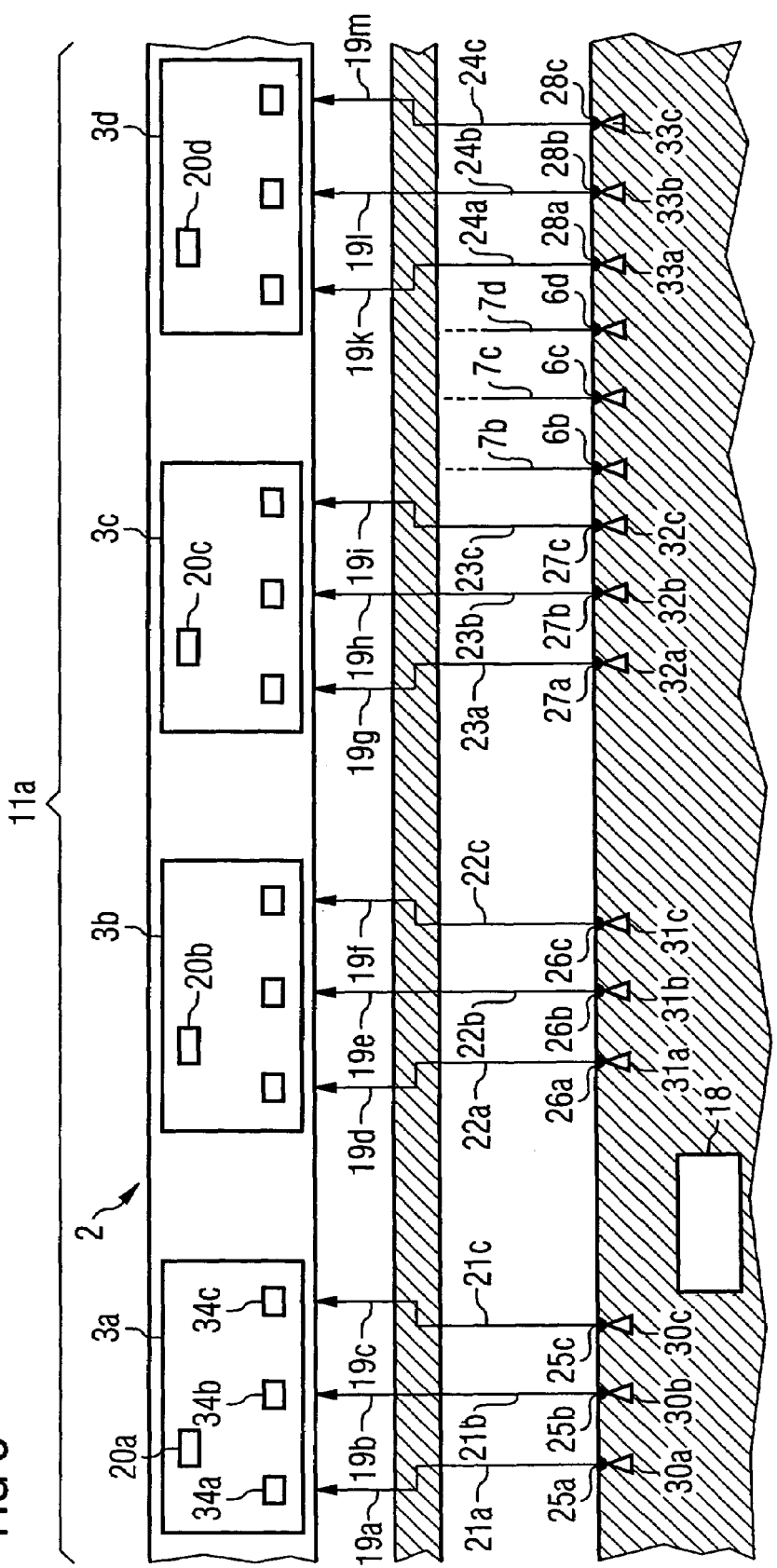

SEMI-CONDUCTOR COMPONENT TESTING SYSTEM WITH A REDUCED NUMBER OF TEST CHANNELS

This application claims priority from pending German Patent Application No. 102 41 141.7 filed on Sep. 5, 2002.

FIELD OF THE INVENTION

The invention relates to a device, more particularly a wafer with several semi-conductor components to be tested according to the preamble of claim 1, a semi-conductor component testing system as well as to a process for testing semi-conductor components.

Semi-conductor components, e.g. respective integrated (analog and/or digital) computer gate circuits, semi-conductor memory components e.g. function memory components (PLAs, PALs, etc.) and table memory components (e.g. ROMs and RAMs, especially SRAMs and DRAMs), etc. are for instance subjected to extensive testing in a completed and/or in a semi-completed state.

The signals required for testing semi-conductor components that may for example still be present on the respective wafer, may for instance be generated by a test device connected to a semi-conductor component test card ("probe card") and applied to the respective semi-conductor components by means of needle-shaped connectors built into the test card.

The signals emitted by the semi-conductor components in response to the applied test signals are scanned by respective needle-shaped probe card connectors and relayed to the test device where the respective signals may be evaluated.

In order to test the largest possible number of semi-conductor components in parallel and/or simultaneously with one and the same test device, an appropriate test signal emitted by the test device—may be simultaneously applied to several, e.g. n=4 different semi-conductor components constituting one test group.

In this way for instance n×k, e.g. 4×k different semi-conductor components may be tested simultaneously with the aid of k separate test signals made available at separate test device connections (i.e. tested simultaneously with k separate test channels), thereby saving test channels.

In particular test processes, e.g. in the soft trimming process for the adjustment of internal voltages in semi-conductor components, it is not possible to use one and the same test channel for several different semi-conductor components, especially for all of those in the current test group.

Instead the respective test process, e.g. the current soft trimming process, must be performed separately on each semi-conductor component, in particular on those contained in the respective test group (in other words on each chip individually).

For selecting and/or addressing the respective semi-conductor components, a number of separate CS connections and/or CS channels (chip select and/or semi-conductor component selection channels), e.g. one relevant to the number of semi-conductor components in the respective test group—must be provided, whereby a respective CS signal can be emitted from the respective test device at its respective CS connections, separately for each of the respective semi-conductor components contained in the test group.

In this way, it can be signaled to a particular semi-conductor component, connected to the respective CS channel, whether the signal present at the—shared—test channel should be valid for the respective semi-conductor component (e.g. when a relevant test procedure for several semi-conductor components, or for instance a soft-trimming process for the respective semi-conductor component, is to be performed simultaneously), or not (for example, when a soft trimming-process is at the same time due to be performed by the shared test channel for a semi-conductor component).

In this case the relatively high number of separate CS channels and/or CS connections needed for addressing the respective semi-conductor components involved is a disadvantage.

The invention aims to provide a novel device, in particular a wafer with several semi-conductor components to be tested, a novel semi-conductor component testing system, as well as a novel process for testing semi-conductor components.

It achieves this and further ends by means of the subject matters of claims 1, 10 and 11.

Further advantageous aspects of the invention are listed in the sub-claims.

According to a basic concept of the invention, a device, in particular a wafer with several semi-conductor components to be tested, is provided whereby each semi-conductor component is assigned an individual identifying label, more particularly an identity number, in order to perform—for each respective semi-conductor component individually—a test on the respective semi-conductor component.

In this way it is possible for each component on which the individual test is to be done, to identify itself by means of the above-mentioned identity number.

This dispenses with the necessity for providing a respective CS channel (chip select and/or semi-conductor selection channel) for each semi-conductor component separately, which enables the number of (test) channels to be reduced.

Below, the invention is more closely explained by use of examples of embodiments thereof and by the attached drawings.

BRIEF DESCRIPTION OF THE DRAWINGS

FIG. 3 is a schematic representation of a semiconductor component testing system with a semi-conductor component test card and a semi-conductor component test device, as well as of semi-conductor components to be tested, arranged and presented in such a way that a component identification and addressing process can be performed according to the second embodiment example of the present invention.

DETAILED DESCRIPTION OF THE DRAWINGS

Figure 1:
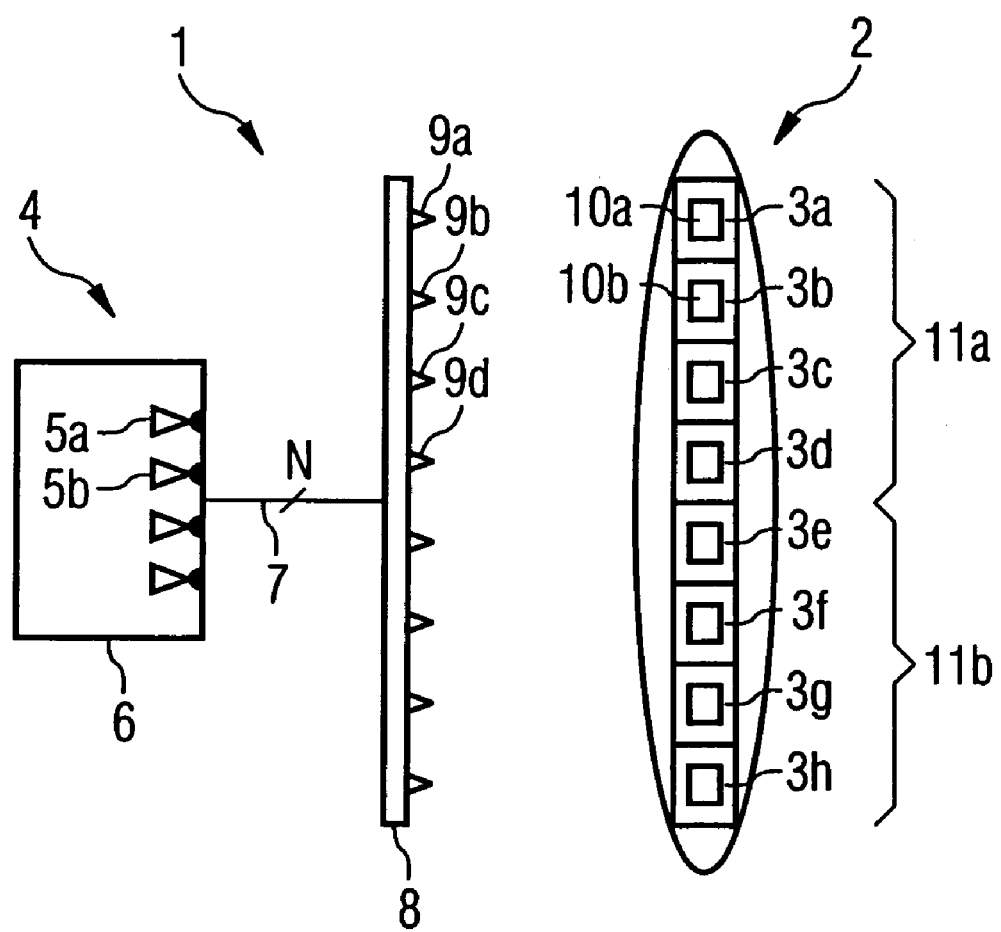
FIG. 1 is a schematic representation of the principal construction of the semi-conductor component testing systems used in the present invention.

FIG. 1 shows a schematic representation of the main construction details of the semi-conductor component testing system used in the present invention.

This serves to test the semi-conductor components 3a, 3b, 3c, 3d that have been created on the silicon wafer (or the semi-conductor components 3a, 3b, 3c, 3d arranged on wafer 2 in semi-completed and/or completed form). The semi-conductor components 3a, 3b, 3c, 3d may be—completed or semi-completed—semi-conductor components, e.g. respective integrated (analog and/or digital) computer gate circuits, or semi-conductor memory components, e.g. functional memory components (PLAs, PALs, etc.) or table memory components (e.g. ROMs or RAMS), especially SRAMs or DRAMs (here for instance DRAMs (Dynamic Random Access Memories and/or dynamic read/write memories) with double data rate (DDR-DRAMs= Double Data Rate DRAMs)).

The test signals to be applied for testing the semi-conductor components 3a, 3b, 3c, 3d are generated by a test device 4, and applied to the respective connections 6 of the test device 4 by means of the respective signal driver devices 5a and 5b.

As further shown in FIG. 1, the connections 6 of the testing device 4 (through the respective conductors, here a number n of lines 7) may be connected to the respective connections of a semi-conductor component test card 8 and/or probe card 8—which may be connected to respective connections provided on the semi-conductor components 3a, 3b, 3c, 3d (test) connections 10a, 10b by means of respective contact needles 9a, 9b, 9c, 9d, which are connected to the probe card connections The test input signal emitted by testing device 4 may thereby be applied to the required semi-conductor components 3a, 3b, 3c, 3d in each case, by means of lines 7, the contact needles 9a, 9b, 9c, 9d of the semi-conductor component-test card 8, and the respective semi-conductor component connections 10a, 10b.

The test signals emitted in reaction to the test input signals applied to the respective (e.g. the above or other, different) semi-conductor component connections 10a, 10b—correspondingly inverted as described above in relation to the test input-signals—are scanned by the respective contact needles 9a, 9b, 9c, 9d of the semi-conductor component test card 8, and relayed to respective connections of the testing device 4 via the above connections 7, where an evaluation of the emitted test signals may then take place.

In order to test the largest possible number of semi-conductor components 3a, 3b, 3c, 3d in parallel and/or simultaneously by one and the same test device 4, the test input signal emitted at a particular connection 5a of the testing device 4 (e.g. by respective branch connections provided) may—simultaneously—be transferred to n different semi-conductor components 3a, 3b, 3c, 3d, (e.g. here to n=4 different semi-conductor components 3a, 3b, 3c, 3d forming a test group 11a of m (e.g. m=16) different test groups 11a, 11b (whereby a respective test input signal emitted at a connection 5b of the testing device 4 is relayed to n=4 further semi-conductor components 3e, 3f, 3g, 3h forming a further test group 11b, etc.—or alternatively, to all semi-conductor components 1 (e.g. I=64 semi-conductor components 3a, 3b, 3c, 3d, 3e, 3f, 3g, 3h arranged on wafer 2)).

In this way n×k (or for example I×k) different semi-conductor components 3a, 3b, 3c, 3d may be tested simultaneously with the aid of test input signals applied at k different testing device connections 5a, 5b (i.e. with k different test channels).

For particular test procedures, e.g. when adjusting for particular internal voltages using the soft trimming process, it is impossible to use one and same test input signal simultaneously for several different semi-conductor components 3a, 3b, 3c, 3d, in particular for all semi-conductor components 3a, 3b, 3c, 3d contained in the respective test group 11a, 11b (and/or arranged on wafer 2).

Instead, the respective test process, e.g. the soft trimming process being performed on each semi-conductor component 3a, 3b, 3c, 3d (in the respective test group 11a, 11b, and/or arranged on the wafer) must be done separately.

Figure 2:
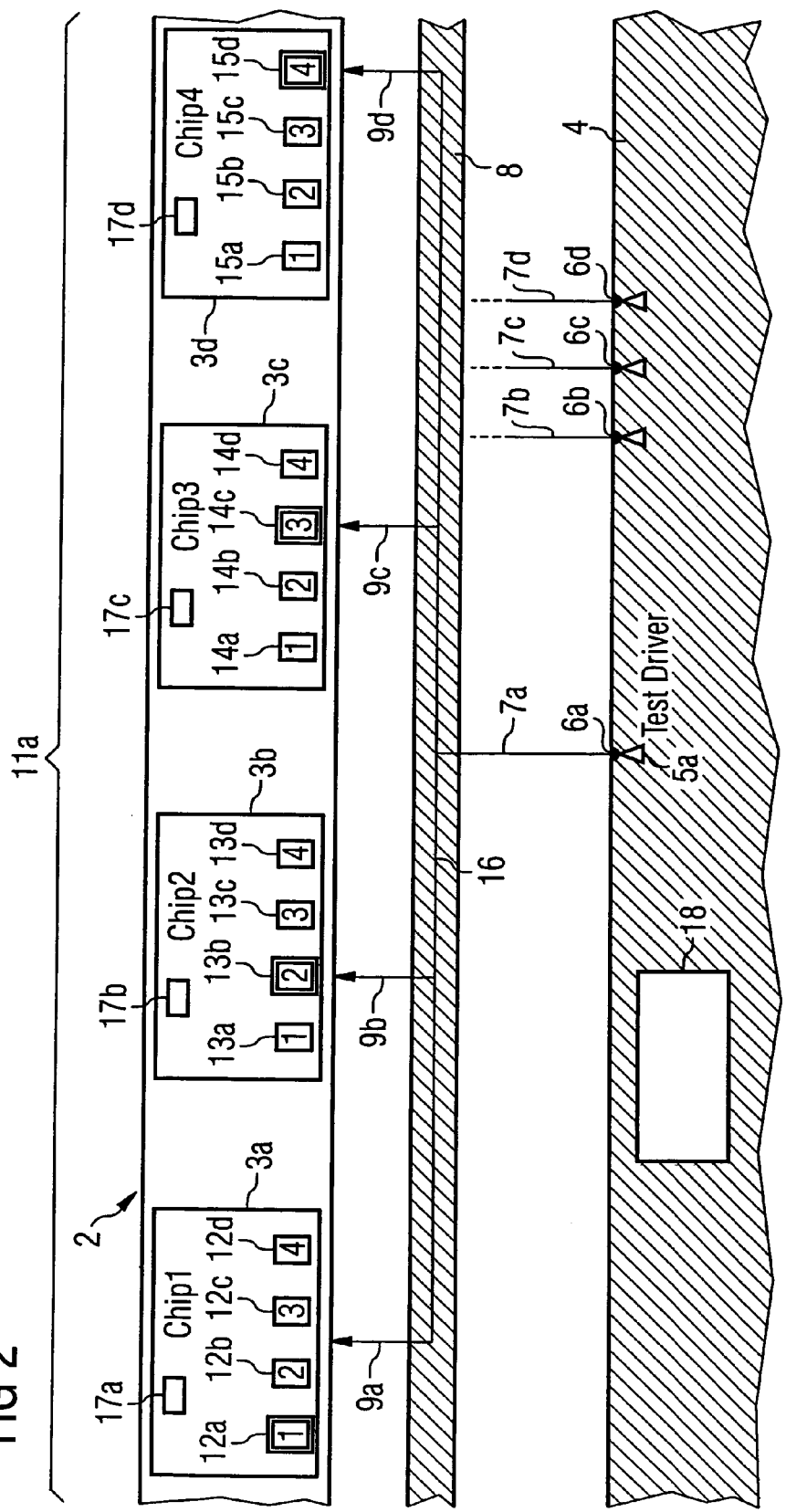
FIG. 2 is a schematic representation of a semi-conductor component testing system with a semi-conductor component-test card, a semi-conductor component test device, as well as semi-conductor components to be tested, arranged and presented in such a way that a component identification and addressing process can be performed according to the first embodiment of the present invention.

In order to address and/or select the respective semi-conductor components 3a, 3b, 3c, 3d, they (and/or the semi-conductor component test device 4 and/or the semi-conductor component-test card 8), may in each case be arranged in a particular way in the present invention as detailed below, and the process illustrated in detail below initiated:

FIG. 2 shows the exact formal arrangement of the semi-conductor component test card 8 shown in FIG. 1, the semi-conductor component test device 4 shown in FIG. 1 as well as the semi-conductor components (here the semi-conductor components 3a, 3b, 3c, 3d contained in the first test group 11a) to be tested as found on wafer 2 in the first embodiment example of the invention (in which a component identification and addressing process is initiated according to the first embodiment example of the present invention).

As shown in FIG. 2, the semi-conductor components 3a, 3b, 3c, 3d have all been identically constructed and arranged and show—in contrast to current semi-conductor components—a respective number n (here: n=4, and/or 1, here 1=64) of additional semi-conductor component identification connections 12a, 12b, 12c, 12d, 13a, 13b, 13c, 13d, 14a, 14b, 14c, 14d, 15a, 15b, 15c, 15d, at the same locations in each case, at the present semi-conductor components 3a, 3b, 3c, 3d (or alternatively the number I of all semi-conductor components 3a, 3b, 3c, 3d contained in on wafer 2 and due to be tested by testing device 4) here the respective number n contained in the first test group, here n=4 (and/or I, here: I=64).

A semi-conductor component (binary) identification signal (and/or chip selection semi-conductor component selection signal) emitted by a respective signal driver device at a respective connection (here: the connection 5a) of the test device 4 of a respective signal driver device (here: the signal driver device 5a) is relayed via a respective line 7a of the above mentioned N lines 7 to the semi-conductor component-test card 8, and from there—via a respective connection 16—to all contact needles 9a, 9b, 9c, 9d allocated to one of the semi-conductor components 3a, 3b, 3c, 3d different to n (e.g. n=4) belonging to test group 11a, (or alternatively to all contact needles 9a, 9b, 9c, 9d allocated to semi-conductor components 3a, 3b, 3c, 3d different to 1 (e.g. 1=64)).

Each contact needle 9a, 9b, 9c, 9d contacts the allocated semi-conductor component 3a, 3b, 3c, 3d at a connection that in each case differs from the additional semi-conductor component identification connections 12a, 13b, 14c, 15d above. This may be achieved by always placing the respective contact needles 9a, 9b, 9c, 9d at locations opposite to the respective component identification connections 12a, 13b, 14c, 15d on the semi-conductor component test card 8.

For example, a first contact needle 9a contacts the (first) semi-conductor component 3a at its first semi-conductor component identification connection 12a, a second contact needle 9b the (second) semi-conductor component 3b at its second semi-conductor component identification connection 13b, a third contact needle 9c the (third) semi-conductor component 3c at its third semi-conductor component identification connection 14c, and a fourth contact needle 9d the (fourth) semi-conductor component 3d at its fourth semi-conductor component identification connection 15d.

The above semi-conductor component identification signal is thereby relayed via line 7a, the connection line 16, and the first, second, third and/or fourth contact needle 9a, 9b, 9c, 9d to the first semi-conductor component identification connections 12*a* (of a total of four (alternatively e.g. 64) semi-conductor component identification connections 12*a*, 12*b*, 12*c*, 12*d*) of the first semi-conductor components 3*a*, as well as to the second semi-conductor component identification signal 13*b* (of a total of four (alternatively e.g. 64) semi-conductor component identification connections 13*a*, 13*b*, 13*c*, 13*d*) of the second semi-conductor components 3*b*, and to the third and/or fourth semi-conductor component identification signal 14*d* and/or 15*e* (of a total of four (alternatively e.g. 64) semi-conductor component identification connections 14*a*, 14*b*, 14*c*, 14*d* and/or 15*a*, 15*b*, 15*c*, 15*d*) of the third and/or fourth semi-conductor components 3*c* and/or 3*d*.

Each semi-conductor component 3*a*, 3*b*, 3*c*, 3*d* contains a detection device 17*a*, 17*b*, 17*c*, 17*d*, in particular a respective switching device, which determines "if" and when "yes": at which semi-conductor component identification connection 12*a*, 13*b*, 14*c* or 15*d*, the above semi-conductor component identification signal appears (more accurately "if", and when "yes": at which semi-conductor component identification signal 12*a*, 13*b*, 14*c* or 15*d* a "high logic" (or alternatively: "low logic") voltage level is present.

In this way, each of the semi-conductor components 3*a*, 3*b*, 3*c*, 3*d* may identify themselves (i.e. acknowledge whether the above semi-conductor component identification signal represents the first, second, third, or fourth semi-conductor component 3*a*, 3*b*, 3*c*, 3*d*—within test group 11*a* (or alternatively: all semi-conductor components on wafer 2)—(according to whether the semi-conductor component identification signal is in every case present at the first, second, third or fourth semi-conductor component identification connection 12*a*, 13*b*, 14*c* or 15*d*)), so that the detection device may, according to the result of the detection process, allocate an unambiguous identification number to each of the semi-conductor components 3*a*, 3*b*, 3*c*, 3*d* (within test group 11*a*, or in total). (e.g. for the "first" semi-conductor component 3*a* the respective binary number "001", for the "second" semi-conductor component 3*b* e.g. the respective binary number "010", for the "third" semi-conductor component 3*c* the respective binary number "011", and for the "fourth" semi-conductor component 3*d* the respective binary number "100").

As further shown in FIG. 2, the testing device 4 contains a memory device 18, into which the test software for each of the tests to be done has been downloaded.

Each test to be done may be allocated a test mode number, which identifies the respective test.

To signal the semi-conductor components 3*a*, 3*b*, 3*c*, 3*d* which test is to be done, the test mode number (and/or test-mode address) identifying the respective test is relayed—in a self-evident fashion—and controlled by the above-mentioned test software.

For this, the respective test mode number is relayed to all semi-conductor components 3*a*, 3*b*, 3*c*, 3*d* on wafer 2, and/or to all semi-conductor components 3*a*, 3*b*, 3*c*, 3*d* in the respective test group 11*a*, by means of a respective emitted binary address signal from the testing device 4 to the respective connections 6*b*, 6*c*, i.e. via "shared" address channels, i.e. that are used jointly by all semi-conductor components 3*a*, 3*b*, 3*c*, 3*d* on the wafer 2 (or by all semi-conductor components 3*a*, 3*b*, 3*c*, 3*d* in the test group 11*a*).

The binary address signal is in each case relayed to the semi-conductor component-test card 8 via lines 7*b*, 7*c*, 7*d* of the above-mentioned N connections—to which each of the above-mentioned respective connections 6*b*, 6*c*, 6*d* is linked—and here—via respective connection lines not shown here, and respective contact needles, also not shown here—in each case to all semi-conductor components 3*a*, 3*b*, 3*c*, 3*d* on wafer 2 (and/or to all semi-conductor components 3*a*, 3*b*, 3*c*, 3*d* within a test group 11*a*).

In the present embodiment the above-mentioned address connections 6*b*, 6*c*, 6*d*(and/or the address channels described above) are also used—apart from relaying mode numbers—to select a particular semi-conductor component from all the semi-conductor components in total and/or from the semi-conductor components 3*a*, 3*b*, 3*c*, 3*d* in a respective test group 11*a*, for instance when a respective test-process, for example a soft trimming process of a particular semi-conductor component 3*a*, 3*b*, 3*c*, 3*d* is to be done separately in parallel, and not simultaneously with all the semi-conductor components 3*a*, 3*b*, 3*c*, 3*d* on the wafer 2 (and/or all the semi-conductor components 3*a*, 3*b*, 3*c* 3*d* in the present test group 11*a*).

In the process—in order to address the required semi-conductor components 3*a*, 3*b*, 3*c*, 3*d* in each case—an (address) number selected by the respective test software is relayed via the address connections 7*b*, 7*c*, 7*d* to all the semi-conductor components 3*a*, 3*b*, 3*c*, 3*d* on the wafer 2 (and/or all semi-conductor components contained in a particular test group 11*a*), (for instance the binary number "001" to address the first semi-conductor component 3*a*, for example the binary number "010" for addressing the second semi-conductor component 3*b*, for example the binary number "011" for addressing the third semi-conductor component 3*c*, and the binary number "100" for example for addressing the fourth semi-conductor component 3*d*).—in other words, "new", additional and test mode numbers otherwise never used are generated and relayed to address the semi-conductor components 3*a*, 3*b*, 3*c*, 3*d*, whereby each "test mode" and/or address number may be selected in such a way that it corresponds with the identification-number of those semi-conductor components that need to be actuated and/or addressed.

The relayed ("test mode" and/or address) number is (momentarily) made available to each semi-conductor component 3*a*, 3*b*, 3*c*, 3*d* by means of each of the above-mentioned detection devices 17*a*, 17*b*, 17*c*, 17*d*, or (in the meantime) compared with an identification-number written into a respective identification number register; if it is found that the identification number registered by the respective detection devices 17*a*, 17*b*, 17*c*, 17*d* and the address number relayed via the address channels correspond, it is registered that the respective semi-conductor component 3*a*, 3*b*, 3*c*, 3*d* corresponds with the actually selected and/or addressed semi-conductor component 3*a*, 3*b*, 3*c*, 3*d*.

By means of the component identification and addressing process described above, the number of test channels can—in contrast with currently available semi-conductor component testing systems—reduce the number of test channels. In particular the need to provide a separate, additional CS channel—for each semi-conductor component 3*a*, 3*b*, 3*c*, 3*d* (and/or for each semi-conductor component 3*a*, 3*b*, 3*c*, 3*d* within a respective test group 11*a*)—instead, only a single, additional signal connection 6*a* and/or semi-conductor component identification channel (here: the above-mentioned line 7*a*) must be made available to all semi-conductor components 3*a*, 3*b*, 3*c*, 3*d* in total (or—alternatively—to each of the above-mentioned various m test groups 11*a*, 11*b*) (i.e. here for instance for all semi-conductor components of all test groups n together—one single semi-conductor component identification channel, or for instance—depending on the number of test groups—a number m, for example m=16, semi-conductor component identification channels).

FIG. 3 shows the exact embodiment of the semi-conductor component-test card 8 shown in FIG. 1, the semi-conductor component test device 4 shown in FIG. 1 as well as the semi-conductor components on the wafer 2 to be tested (here: the semi-conductor components 3a, 3b, 3c, 3d contained in the first test group 11a) in a second embodiment of the invention (in which a different component identification process—compared to the process described above—is applied).

As shown in FIG. 3, the semi-conductor components 3a, 3b, 3c, 3d are all identically arranged.

In contrast to the embodiment shown in FIG. 2, no (additional, separate) semi-conductor component identification connections 12a, 12b, 12c, 12d and/or a single, additional special semi-conductor component identification channel 7a (or several similar channels) are foreseen for identifying the semi-conductor components 3a, 3b, 3c, 3d; instead "currently available" test channels 30a, 30b, 30c, 31a, 31b, 31c, 32a, 32b, 32c, 33a, 33b, 33c, e.g. so-called DQ channels and/or DQ-Channels, are separately installed for the individual semi-conductor components 3a, 3b, 3c, 3d, but employed in a novel way in each case.

As shown in FIG. 3, the (binary) test signal emitted at the separate test channels 30a, 30b, 30c, 31a, 31b, 31c, 32a, 32b, 32c, 33a, 33b, 33c is relayed to a respective connection 25a, 25b, 25c, 26a, 26b, 26c, 27a, 27b, 27c, 28a, 28b, 28c of the testing device 4 via respective connections 21a, 21b, 21c, 22a, 22b, 22c, 23a, 23b, 23c, 24a, 24b, 24c to the semi-conductor component-test card 8, and from there via a respective contact needle 19a, 19b, 19c, 19d, 19e, 19f, 19g, 19h, 19i, 19k, 19l, 19m, and a respective component test signal connection 34a, 34b, 34c—in contrast to shared, i.e. all communal test channels used by especially all semi-conductor components on the wafer 2 and/or a test group 11—only to one single semi-conductor component 3a, 3b, 3c, 3d, individually allocated to the respective separate test channel.

In the present embodiment, the above-mentioned test channels 30a, 30b, 30c, 31a, 31b, 31c, 32a, 32b, 32c, 33a, 33b, 33c—in contrast to current usage—are not only used for relaying "actual" test signals for performing specific tests, but also for relaying a uniquely allocated identification number to each semi-conductor component 3a, 3b, 3c, 3d (and/or to each respective semi-conductor component in test group 11a) separately to the respective semi-conductor component 3a, 3b, 3c, 3d (among all components, or only within the respective test group 11 a), in other words the test channels 30a, 30b, 30c, 31a, 31b, 31c, 32a, 32b, 32c, 33a, 33b, 33c are additionally used as semi-conductor component identification channels for relaying respective semi-conductor component identification signals.

For example—controlled by test software stored in memory device 18—the respective binary number "001" is relayed via the above-mentioned test channels 30a, 30b, 30c, 31a, 31b, 31c, 32a, 32b, 32c, 33a, 33b, 33c to the "first" semi-conductor component 3a as its allocated identification-number, the respective binary number "010" to the "second" semi-conductor component 3b as its allocated identification-number, and the respective binary numbers "011" and/or "100" to the "third" and/or "fourth" semi-conductor components 3c, 3d as their allocated identification-numbers.

This takes place during a special test mode to which a particular test mode number has been allocated. This is relayed in the usual fashion and—as described in relation to FIG. 2—before the respective semi-conductor component identification signals and/or identification-numbers have been relayed via the above-mentioned test channels 30a, 30b, 30c, 31a, 31b, 31c, 32a, 32b, 32c, 33a, 33b, 33c—to the respective semi-conductor components 3a, 3b, 3c, 3d, by means of a binary (test mode address) signal containing the test mode number and relayed to the respective address-connections 6b, 6c, 6d via respective connections 7b, 7c, 7d to all and/or all semi-conductor components 3a, 3b, 3c, 3d within the respective test group 11a.

The identification-number received by the respective semi-conductor components 3a, 3b, 3c, 3d via the respective test channels 30a, 30b, 30c, 31a, 31b, 31c, 32a, 32b, 32c, 33a, 33b, 33c, are memorized there in respective—additional—identification number registers 20a, 20b, 20c, 20d.

In the present embodiment—like the embodiment described in relation to FIG. 2—the above-mentioned address-connections 6b, 6c, 6d (and/or the (test mode address) channels described above)—apart from relaying "actual" test mode-numbers—are also used to select a specific semi-conductor component from all the semi-conductor components and/or from the semi-conductor components 3a, 3b, 3c, 3d in a respective test group 11a, for instance when a respective test-process, for example the soft trimming process of a particular semi-conductor component 3a, 3b, 3c, 3d is to be done separately and in parallel, and not simultaneously with all semi-conductor components 3a, 3b, 3c, 3d on the wafer 2 (and/or all semi-conductor components 3a, 3b, 3c, 3d within the respective test group 11a).

In the process—in order to address the required semi-conductor components 3a, 3b, 3c, 3d in each case—an (address) number selected by the respective test software is relayed via the address-connections 7b, 7c, 7d to all the semi-conductor components 3a, 3b, 3c, 3d on the wafer 2 (and/or all semi-conductor components contained in particular test group 11a) (for instance the binary number "001" to address the first semi-conductor component 3a, the binary number "010" for addressing the second semi-conductor component 3b, the binary number "011" for addressing the third semi-conductor component 3c, and the binary number "100" for addressing the fourth semi-conductor component 3d)—in other words, "new", additional and otherwise never used test mode numbers are generated and relayed to address the semi-conductor components 3a, 3b, 3c, 3d, whereby each "test mode" and/or address number may be selected in such a way that it corresponds with the identification-number of those semi-conductor components that need to be activated and/or addressed.

The relayed ("test mode" and/or address) number in each semi-conductor component 3a, 3b, 3c, 3d is compared to the identification number stored in the identification-number register 20a, 20b, 20c, 20d; if it is determined that the respective identification number and the address number relayed by the address channels are identical, it is recorded that the respective semi-conductor component 3a, 3b, 3c, 3d is identical to the actually selected and/or addressed semi-conductor component 3a, 3b, 3c, 3d.

In this way the respective semi-conductor component 3a, 3b, 3c, 3d can be signaled that signals subsequently submitted to a—shared—test channel, e.g. for performing a soft trimming process, should be valid for the respective semi-conductor components 3a, 3b, 3c, 3d (but not for other semi-conductor components, and/or for the other semi-conductor components in the respective test group 11a).

By means of the component identification—and address—process it is possible to reduce the number of test channels—compared to currently available semi-conductor component testing systems. In particular, the preparation of separate, additional CS and/ semi-conductor component identification channels may be dispensed with—the identification and addressing of semi-conductor components 3a, 3b, 3c, 3d is done by means of—already available—test and address channels (in fact, by the above-mentioned test channels 30a, 30b, 30c, 31a, 31b, 31c, 32a, 32b, 32c, 33a, 33b, 33c, and the above-mentioned address channels 7b, 7c, 7d).

As an alternative to the above-mentioned identification numbers relayed via the test channels 30a, 30b, 30c, 31a, 31b, 31c, 32a, 32b, 32c, 33a, 33b, 33c to the respective semi-conductor components 3a, 3b, 3c, 3d and stored there in the identification number registers 20a, 20b, 20c, 20d, the numbers—corresponding to the identification-numbers—may for instance also be stored in the respective semi-conductor component 3a, 3b, 3c, 3d before testing the semi-conductor components 3a, 3b, 3c, 3d, for example by using so-called "fuses" or "e-fuses" (i.e. by means of burnt-in electrical contacts—corresponding to the respective numbers to be encoded—provided on the semi-conductor components 3a, 3b, 3c, 3d) (whereby the respective "fuse"—or "e-fuse" number (and/or identification-number) is compared during addressing the semi-conductor components 3a, 3b, 3c, 3d,—as described above—with the respective addressing number relayed over the address channels 7b, 7c, 7d).

What is claimed is:

1. A device to be tested by a test device comprising:
    a plurality of semi-conductor components to be tested by the test device;
    a plurality of identification numbers corresponding to and allocated to said plurality of semi-conductor components, said plurality of identification numbers individually identifying the respective semi-conductor component to be tested;
    said plurality of semi-conductor components each having a plurality of electrical contacts, each contact being allocated to a different one of said identification numbers;
        wherein a respective identification number is transmitted from the test device to a respective semi-conductor component by providing a signal to an electrical contact of the respective plurality of electrical contacts of the respective semi-conductor component that is allocated to the identification number.

2. The device according to claim 1, in which each semi-conductor component has at least two connections—mutually respective with the respective semi-conductor components—, more particularly separate semi-conductor component identification connections, and a respective label is relayed from the test device to the respective semi-conductor component(s) by making available a respective signal from the test device at the first connection of a first semi-conductor component and at a second connection of the second semi-conductor component.

3. The device according to claim 2, in which the signal is emitted at the particular connection of the test device, which is connected to a first and a second contact connection, whereby the first contact connection contacts the first connection of the first semi-conductor component, and the second contact connection the second connection of the second semi-conductor component.

4. The device according to claim 1, wherein the respective identification number is relayed to the respective semi-conductor component(s) from the test device by means of separately provided channels for each semi-conductor component.

5. The device according to claim 4, in which the separately provided channels are used for the transfer of actual test data before or after relaying a respective label.

6. The device according to claim 5, in which an address identification is sent to the semi-conductor components to select and/or address a particular semi-conductor component, and is compared in the respective semi-conductor component with the respective label, more particularly the identification number.

7. The device according to claim 6, in which the address identification is sent via a channel, which is also used to select the respective test to be performed.

8. The device according to claim 7, in which the respective identification number is stored in the respective semi-conductor component by burning in respective electrical contacts, more particularly by means of fusing or e-fusing-processes.

9. A process for testing components, comprising the following steps:
    providing an assembly with a plurality semi conductor components to be tested;
    transmitting identification numbers from a test device to the semi-conductor components in order to perform, for each respective semi-conductor component individually, a test on the respective semi-conductor component, the identification numbers individually identifying the respective semi-conductor component to be tested, the semi-conductor components each comprising a plurality of electrical contacts, each of the contacts being allocated to a different one of the identification numbers;
        wherein a respective identification number is transmitted from the test device to a respective semi-conductor component by providing a signal to that electrical contact of the respective plurality of electrical contacts of the respective semi-conductor component that is allocated to the identification number to be transmitted to the respective semi-conductor component.

10. A component testing system comprising:
    a test device; and
    an assembly with a plurality of semi-conductor components to be tested;
    a plurality of identification numbers corresponding to and allocated to said plurality of semi-conductor components, said plurality of identification numbers individually identifying the respective semi-conductor component to be tested;
    said plurality of semi-conductor components each having a plurality of electrical contacts, each contact being allocated to a different one of said identification numbers;
        wherein a respective identification number is transmitted from the test device to a respective semi-conductor component by providing a signal to an electrical contact of the respective plurality of electrical contacts of the respective semi-conductor component that is allocated to the identification number.

11. A semi-conductor component testing system for performing a test on a plurality of semi-conductor components, comprising:
    a test device;
    an assembly with several semi-conductor components to be tested, each semi-conductor component having a plurality of electrical contacts;
    identification numbers allocated to the plurality of semi-conductor components, individually identifying the respective semi-conductor component to be tested, each of the electrical contacts being allocated a different one of the identification numbers; and
    a signal transmitted from said test device to each of the electrical contacts for providing the allocated identification number to the respective electrical contact.

* * * * *